United States Patent [19]

Heimerl et al.

[11] Patent Number: 5,350,963
[45] Date of Patent: Sep. 27, 1994

[54] HOLDER FOR QUARTZ RESONATOR DISKS AND PROCESS FOR THE PRODUCTION OF SUCH HOLDERS

[75] Inventors: Dieter Heimerl, Landshut; Johann Piegendorfer, Altfraunhofen, both of Fed. Rep. of Germany

[73] Assignee: Schott Glaswerke, Mainz, Fed. Rep. of Germany

[21] Appl. No.: 61,355

[22] Filed: May 14, 1993

[30] Foreign Application Priority Data

May 15, 1992 [DE] Fed. Rep. of Germany ....... 4216035

[51] Int. Cl.⁵ .......................................... H01L 41/08
[52] U.S. Cl. ................................................ 310/353
[58] Field of Search ......................... 310/348, 351–356

[56] References Cited

U.S. PATENT DOCUMENTS

| | | | |
|---|---|---|---|
| 2,471,625 | 5/1949 | Johnstone | 310/353 X |
| 2,677,064 | 4/1954 | Hill | 310/353 |
| 2,850,651 | 9/1958 | Hoffman | 310/353 |
| 3,340,410 | 9/1967 | Sanford | 310/353 |
| 4,381,471 | 4/1983 | Filler et al. | 310/353 |
| 4,415,826 | 11/1983 | Kreutzev et al. | 310/354 |
| 4,639,632 | 1/1987 | Nakata et al. | 310/351 |
| 4,639,988 | 2/1987 | Goto et al. | 310/353 X |

FOREIGN PATENT DOCUMENTS

| | | |
|---|---|---|
| 2019389 | 11/1971 | Fed. Rep. of Germany . |
| 2239685 | 3/1973 | Fed. Rep. of Germany . |
| 0084606 | 5/1982 | Japan .................. 310/353 |

*Primary Examiner*—Mark O. Budd
*Attorney, Agent, or Firm*—Millen, White, Zelano, & Branigan

[57] ABSTRACT

In order to improve the flexibility of one-piece quartz mounts, the section of the current lead pins that is pinched into a lug and projects beyond the bottom plate is reduced to a web between the bottom plate and the mounting section. The web is bent twice between the bottom plate and the mounting region so that there are formed a horizontal first web section and a second vertical section. The elasticity of the mounts are thereby further improved. The mounting section can be trimmed in the zone where the quartz disk is mounted.

13 Claims, 3 Drawing Sheets

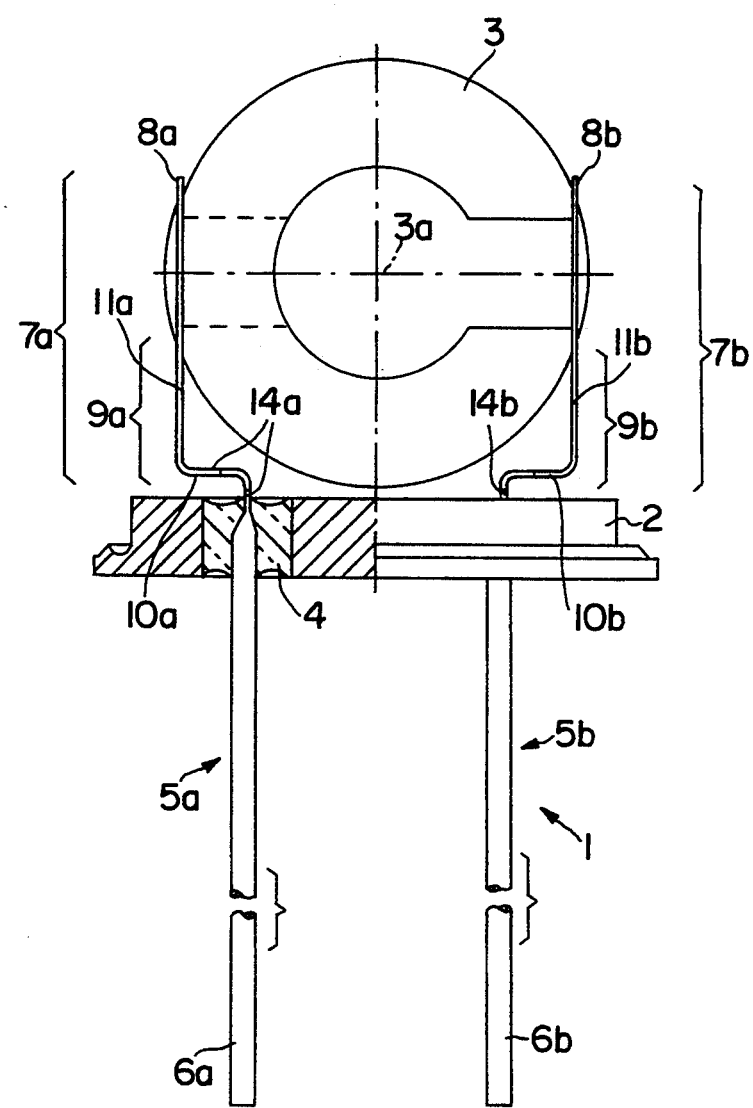
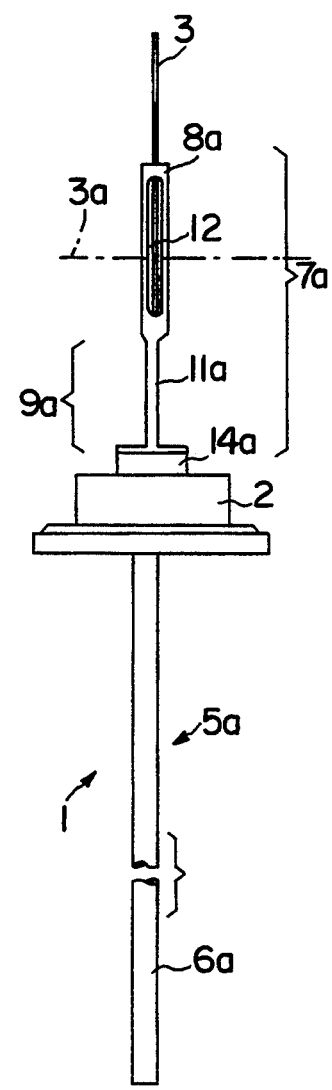
FIG. 1                    FIG. 2

HOLDER FOR QUARTZ RESONATOR DISKS AND PROCESS FOR THE PRODUCTION OF SUCH HOLDERS

BACKGROUND OF THE INVENTION

The invention relates to a holder for quartz resonator disks with a bottom plate and two current lead Dins attached in the bottom plate, these pins each being pinched flat into a lug at one free end starting with their exit from the bottom plate, wherein the lug includes a mounting section for retaining a marginal zone of the quartz resonator disk. The invention also concerns a process for the production of holders for quartz resonator disks.

Quartz resonators are utilized for a large number of applications in the fields of telecommunication technology, communication technology and computer technology. These quartz resonators are excited to oscillate by an electrical voltage, their natural oscillation ranging between several kHz to above 100 MHz depending on technical requirements and design.

Since quartz resonators are extremely sensitive components, they must be hermetically encapsulated and also fixed by extremely flexible holders. Hermetic encapsulation is normally provided by a so-called all-glass housing or a metallic housing. The holders are formed by two flexible springs which latter are soldered or welded on the current leads extending in an insulating fashion in glass through a bottom plate.

The following approximation formula applies for the thickness of the quartz disks d as a function of the frequency f, for a wide frequency range of about 0.8 to 20 MHz:

$$1{,}600/f\,(\text{MHz}) = d\,(\text{micron})$$

It can be seen from this equation that the thickness of the quartz disks decreases with increasing frequency. As a result, the quartz mounts and/or holders for quartz crystals must increase in flexibility with rising working frequency so that effectively preclude damage (for example breakage) of the quartz disk in case of mechanical stress (mechanical shock) of the component is effectively precluded. For this reason, at frequencies of larger than 14 MHz, it is presently possible only to use exclusively welded-on or soldered quartz mounts. Although quartz mounts with a welded-on or soldered-on holder exhibit adequate flexibility, they cannot be produced with sufficient dimensional accuracy. Also, it is impossible to realize the low component heights, demanded in the course of miniaturization, when using welded-on or soldered-on springs.

Such a quartz resonator holder for disk-shaped piezoelectric oscillators, welded to the current lead pins, has been known from DE-OS 20 19 389 (incorporated herein reference), this holder consisting of a ribbon-like strip. In order to attain an improvement in the elastic properties of the holder, the latter is provided with a recess on both sides. However, it has been found that the flexibility of this holder is not as yet sufficient, on account of the relatively small recess, in particular in the direction of motion perpendicular to the quartz disk. Especially in case of quartz disks for more than 14 MHz, the elasticity of this holder is not satisfactory.

Integrated mounts, i.e. quartz mounts produced with the current leads from a single part, wherein the current lead pin is flattened at the top end to receive the quartz and is optionally specially shaped and punched out for mounting the quartz disk, usually cannot be utilized at frequencies above 14 MHz since they do not show adequate flexibility.

These conventional holders have the drawback, in particular, that they can absorb impact and vibration stresses only in the longitudinal direction of the quartz resonator base and diametrically to the marginal zones of the disk, on account of unilateral flat pinching. The mechanical strength of the flattened wire pieces leads to local stresses on the quartz resonator disk and to mechanical damage when the disk is introduced in between two wire sections during assembly and, in particular, in case additional mechanical stresses, such as mechanical shock, impact forces, etc., act on the entire component from the outside.

Integrated quartz mounts have been known from DE-OS 22 39 685 (incorporated herein by reference) wherein the electrical connector pins are shaped to be flat merely at their upper end and are angled approximately in a V-shape. The openings of the V-shaped part are aligned with respect to one another, and the indentations serve for plugging in the quartz disk. This conventional holder likewise lacks adequate flexibility for use at frequencies above 14 MHz. The V-shaped design of the mounting section is not enough for fixing the quartz disk so that the carrier plate must additionally exhibit an elevated portion with a slot-like depression for providing a mount for the edge of the quartz resonator. Since this additional fastening of the quartz disk is not flexible, mechanical stresses lead to damage to the quartz disk.

On the other hand, integrated quartz mounts offer the advantage that the connecting point for current lead-through is defined and can be provided with a narrow dimensional tolerance, and that a substantially smaller height of the component can be realized.

SUMMARY OF THE INVENTION

It is an object of the invention to fashion integrated quartz mounts in such a way that they can also be utilized at higher frequencies (more than 14 MHz) wherein damage to the quartz resonator disk in case of additional mechanical stresses is likewise to be prevented. Another object resides in a process for the production of such quartz resonator holders.

It has been found that the web must be made of maximum length to attain optimum flexibility. Accordingly, the lug is fashioned as a web in the entire region between the bottom plate and the mounting section. The width of the web is clearly narrower than the breadth of the lug, the web width being preferably equal to twice the web thickness. Only the actual mounting section for the quartz resonator disk can have the original lug width.

It has been discovered that the vibration and impact characteristic can be further improved by a reduction of the mass in the zone of the disk mount. For this reason, the lug is additionally trimmed laterally in the region of the mounting section. The web design and the trimming of the mounting section can be provided by means of punching. Preferably, the lug exhibits two symmetrical punched-out portions so that the web is arranged centrally with respect to the mounting section.

Such a design of the holder with the customary angled portions analogously to the disk dimensions with or without slotting in the remaining mounting sections as well as possible V- or funnel-shaped configurations for an improved accommodation of the quartz resonator disks in the holder and during assembly permits a low-attenuation use at high frequencies and, at the same time, provides for good stress behavior during vibrations and mechanical shock.

The low-level beginning of the web, for example above 0.2 mm of the glass seal obtained by melting, offers a deflection on all sides over a large area whereby the flexibility of the holder strips and the impact strength of the installed quartz disk are optimized. As compared with a bipartite holder, a lower structural height is made possible because the post height of the lead-through pins required for the welding-on step is eliminated, and the aforedescribed flexibility manifests itself already in the lower region of the entire quartz holder since there is no interfering transition point in the materials.

The elasticity properties of the quartz resonator holder can be still further improved by the feature that the web, according to another embodiment, is angled between the bottom plate and the mounting section. Preferably, the web is angled directly above the glass seal in the bottom plate for the formation of a horizontal first web section extending substantially in parallel to the bottom plate. This first web section continues in a second web section obtained by a second bend of the web. The mounting section is located at the second web section. This structure of the quartz resonator holder with a first and a second web section, one section being preferably oriented perpendicularly to the other section, leads to a spring torsion upon lateral deflection whereby impact stresses can be flexibly absorbed.

Depending on the design of the mounting section and the attachment of the quartz resonator disk, the first web section can be fashioned to be shorter than the second web section.

The process for producing a holder for quartz resonator disks is characterized by the following process steps. First of all, the current lead pins are pinched flat into a lug in a predetermined section corresponding to the subsequent web and the mounting section. These thus-prepared current lead pins are disposed in the bottom plate by means of a suitable hot-sealing material and fastened in such a way that the lug starts approximately directly above the bottom plate. In the following process step, an electrodeposited coating of the current lead pins is provided, and in the final process step the webs are punched out. Thereafter, the quartz resonator holders are directly packaged.

In case the mounting area is to be provided with a slot, the latter is introduced into the lug for the formation of a mounting zone prior to the hot-sealing of the current lead pins. This offers the advantage that also the inside of the slot-shaped opening is covered with the coating material during electrodeposition.

In case the webs are to be bent, this is preferably done after the punching out of the webs.

According to another version of the process, the lug is trimmed in the mounting zone laterally after the electrodeposition coating step so that the trimmed edges are bare not only in the region of the web but also in the zone of the mounting sections whereby the lateral flexibility is increased. Preferably, punching and trimming are executed in one working step.

Nickel or gold is provided as the coating, the lateral trimming of the mounting regions being especially important in case of nickel because nickel forms a hard, brittle coat usually reducing flexibility.

BRIEF DESCRIPTION OF THE DRAWINGS

Various other objects, features and attendant advantages of the present invention will be more fully appreciated as the same becomes better understood when considered in conjunction with the accompanying drawings, in which like reference characters designate the same or similar parts throughout the several views, and wherein:

FIG. 1 shows a frontal view of a quartz resonator holder wherein the bottom plate is shown partially in a sectional view;

FIG. 2 shows the quartz resonator holder illustrated in FIG. 1 in a lateral view;

DETAILED DESCRIPTION

Figure 3:
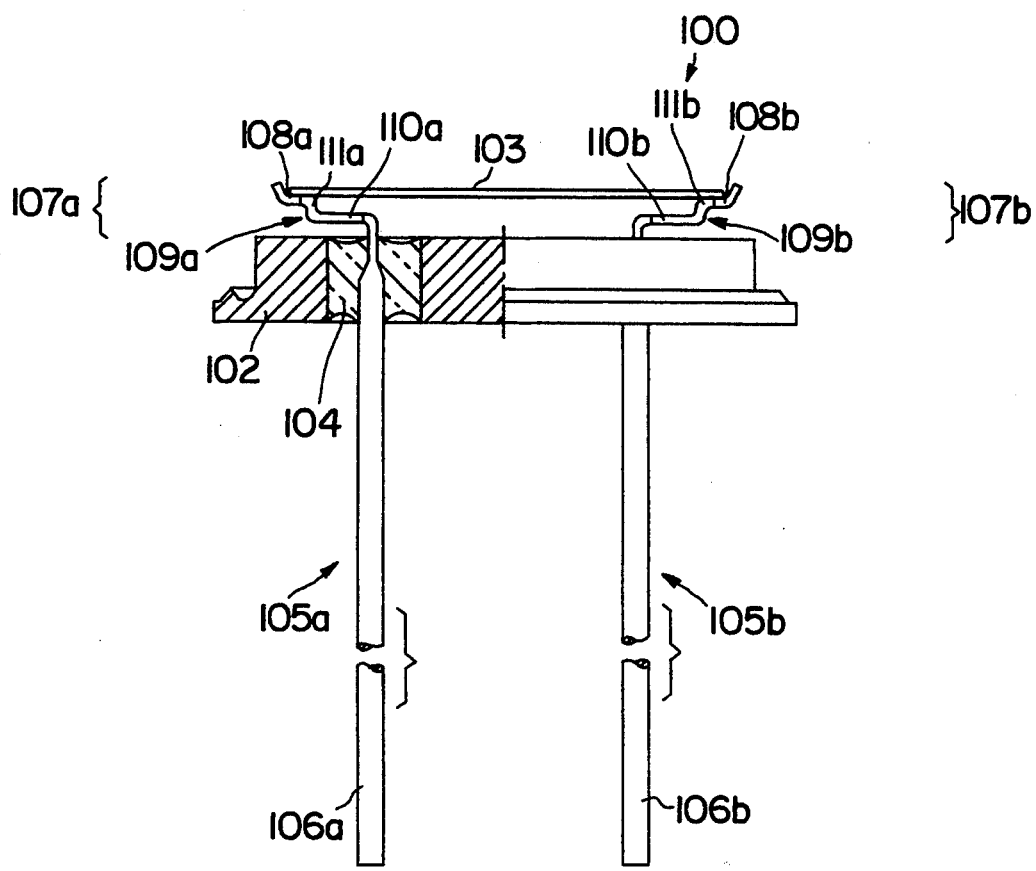
FIG. 3 shows a frontal view of a quartz resonator holder according to a further embodiment wherein the bottom plate is shown partially in section.

FIG. 1 shows a holder 1 in a lateral view. Two current lead pins 5a and 5b are inserted in the bottom plate 2 by means of the glass hot-sealing material 4. The pin sections 6a and 6b, which have not been flattened by pinching, extend into the sealing material 4 and then pass over into the lugs 7a and 7b. These lugs start in the hot-sealing material or directly above the sealing material of the bottom plate 2. The lugs 7a and 7b each have a slot 12 in the mounting section 8a and 8b, respectively, so that the quartz disk 3 can engage into these slots 12 with its marginal zone and is retained resiliently by the lugs 7a and 7b. The quartz disk 3 has an axis 3a which passes through the faces of the disk upon which faces electrodes are disposed in a conventional manner.

As can be seen in FIG. 2, the web 9a, 9b arranged between the mounting section 8a, 8b has a markedly smaller width than the mounting section 8a and, respectively, 8b. The webs 9a, 9b are fashioned to be angled in the region between the mounting sections 8a, 8b and the topside of the bottom plate 2 so that a horizontal web section 10a, 10b and a vertical web section 11a and 11b is respectively formed. In the embodiment shown herein, the horizontal first web section 10a, 10b is shorter than the vertical web section 11a, 11b. The lugs 7a and 7b are flattened in the direction of the axis 3a.

The web section 11b is oriented at a right angle to the web section 10b so that the parallelism of the two mounting sections 8a and 8b, as can be seen in FIG. 1, with respect to each other and with respect to the central axis amounts to less than 3°. The deflection on all sides is about 0.15 mm in the embodiment described herein.

Figure 4:
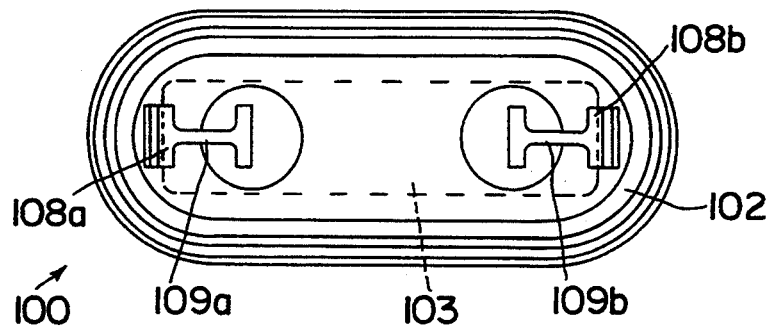
FIG. 4 is a top view of the embodiment shown in FIG. 3.

Another embodiment is shown in FIGS. 3 and 4. The holder 100 likewise comprises a bottom plate 102 into which are sealed, by means of the hot-sealing material 104, current lead pins 105a and 105b. The portion of the current lead pins 105a and 105b projecting beyond the bottom plate 102 is pinched into a lug 107a, 107b, as in the previously described embodiment. The mounting section 108a, 108b, however, differs in the embodiment shown herein from that seen in FIG. 1 and in FIG. 2. This is a so-called "low-profile" design, understood to mean a prone arrangement of the quartz resonator disk 103. The quartz disk 103 is made to be rectangular and lies with its narrow sides on the flatly configured mounting sections 108a, 108b. A web 109a, 109b of a markedly smaller width is provided between the mounting sections 108a and 108b; this web, in the same way as in FIGS. 1 and 2, is illustrated likewise to be angled with the formation of a first web section 110a, 110b and a second web section 111a, 111b.

Figure 6:
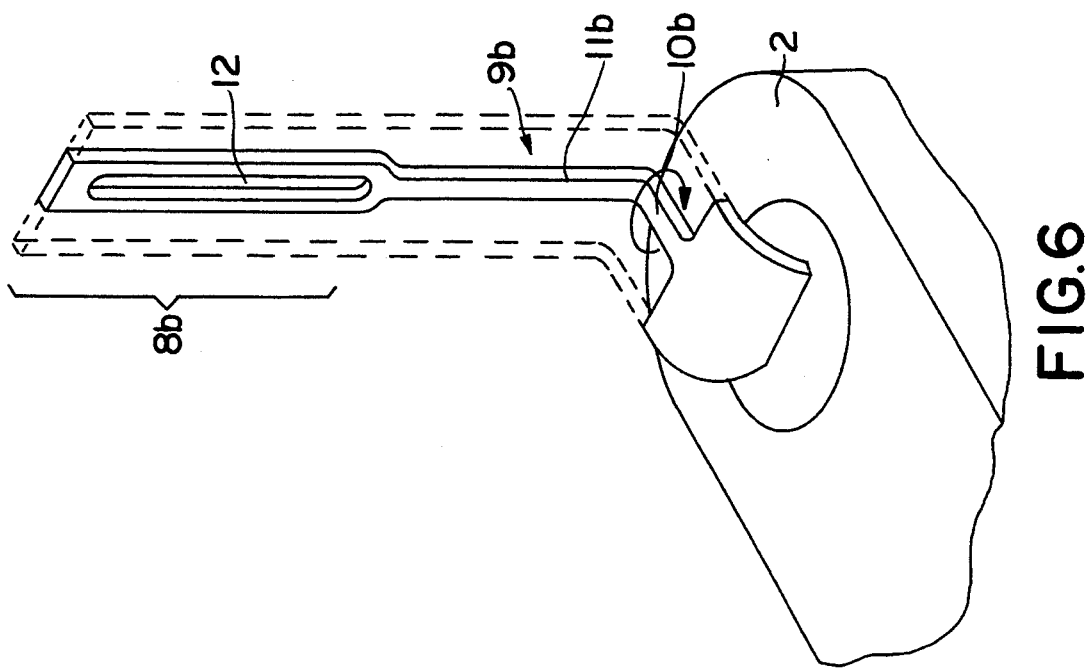
FIGS. 5 and 6 show a lug in a perspective representation before and after formation of the web.
Figure 5:
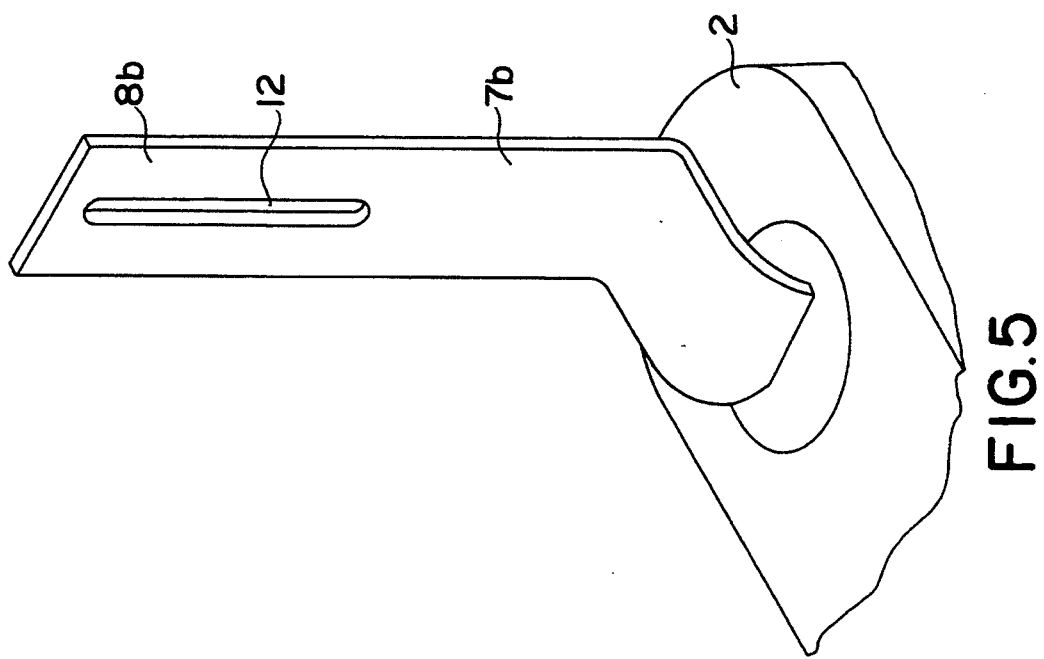

FIGS. 5 and 6 show the lug structure according to this invention as compared with the lug that has not as yet been worked on. The lug 7b according to FIG. 5 has in each case the same width from the bottom plate 2 up into the zone of the mounting section 8b. After punching out the web 9b, while simultaneously also trimming the mounting section 8b along the rim, a quartz holder is created making do with a minimum of material. Note that the lug 7b has a relatively wide flattened portion 14b which extends into the seal 4. This is also readily apparent in FIGS. 1 and 2. The lug 7a also has a relatively wide flattened portion 14a which is proximate the seal 4. On account of this reduction in material in the zone of the web 9b as well as in the region of the mounting section 8b, a marked improvement in flexibility is achieved in all directions. In particular, a lateral deflection of the mounting section 8b results in a spring torsion movement, indicated by the arrow in FIG. 6.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A holder for a quartz resonator disk having opposed electrodes for energizing the disk, the holder comprising:

a pair of lugs passing through glass seals in a supporting base and being unitary with pins on an opposite of the supporting base, each lug being flattened on one side of the base to form a web divided into a first web section, a second web section and mounting section;

the first web sections starting at a location spaced from the glass seals and extending in opposite directions, the first web sections being of a first reduced width;

the second web sections extending parallel to one another and being joined to the first web sections by bends, the second web sections having the same widths as the first web sections; and the mounting sections extending from the second web sections, the mounting sections having second widths greater than the widths of the first and second web sections and the mounting sections each having longitudinal slots for receiving edges of the quartz resonator disk and contacting the electrodes thereon.

2. A holder according to claim 1, wherein in that the web sections each have a width equal to twice its thickness.

3. A holder according to claim 1, wherein the lugs each have at least one punched-out portion for the formation of the webs.

4. A holder according to claim 3, wherein the lugs include two symmetrical punched-out portions.

5. A holder according to claim 4, wherein the webs are angled between the base and the mounting sections.

6. A holder of claim 1, wherein the flattened sections of the lugs extending from the first web sections and into the glass seals have a width greater than the first sections.

7. A holder according to claim 1, wherein the first web sections are shorter than the second web sections.

8. A holder according to claim 7, wherein the lugs are laterally trimmed in the region of the mounting sections.

9. A holder according to claim 1, wherein the webs are angled between the base and the mounting sections.

10. A holder according to claim 1, wherein the lugs are laterally trimmed in the region of the mounting sections.

11. The holder of claim 6, wherein the second sections extend substantially perpendicular to the first sections.

12. The holder of claim 1, wherein the width of the mounting sections are less than the flattened sections of the lug extending into the insulators.

13. The holder of claim 1, wherein the quartz resonator has an axis perpendicular to the faces thereof and wherein the lugs are flattened to extend parallel with the direction of the axis.

* * * * *